United States Patent
Afilani

(10) Patent No.: US 11,614,474 B2
(45) Date of Patent: *Mar. 28, 2023

(54) REMOTE DETECTION OF ANIMATE ENTITIES

(71) Applicant: DKL INTERNATIONAL, INC., Fernandina Beach, FL (US)

(72) Inventor: Thomas L. Afilani, Jersey Shore, PA (US)

(73) Assignee: DKL INTERNATIONAL, INC., Fernandina Beach, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/384,849

(22) Filed: Jul. 26, 2021

(65) Prior Publication Data

US 2022/0026478 A1 Jan. 27, 2022

Related U.S. Application Data

(60) Provisional application No. 63/056,104, filed on Jul. 24, 2020.

(51) Int. Cl.
*G01R 29/08* (2006.01)

(52) U.S. Cl.
CPC .............. *G01R 29/0814* (2013.01)

(58) Field of Classification Search
CPC ............................................... G01R 29/0814
USPC ....................................................... 324/629
See application file for complete search history.

(56) References Cited

U.S. PATENT DOCUMENTS

| | | | |
|---|---|---|---|
| 5,748,088 A | 5/1998 | Afilani | |
| 5,907,280 A * | 5/1999 | Afilani | G01N 27/60 340/568.1 |
| 6,011,476 A * | 1/2000 | Afilani | G08B 13/2491 340/568.1 |
| 6,078,179 A * | 6/2000 | Afilani | G01N 27/60 324/452 |
| 6,346,865 B1 * | 2/2002 | Callewaert | H03H 1/0007 333/184 |
| 6,411,099 B1 | 6/2002 | Afilani | |

(Continued)

FOREIGN PATENT DOCUMENTS

WO  WO 98/48267  10/1998

OTHER PUBLICATIONS

Sekanina, Lukas, Richard Ruzicka, and Zbysek Gajda. "Polymorphic FIR filters with backup mode enabling power savings." 2009 NASA/ESA Conference on Adaptive Hardware and Systems. IEEE, 2009. (Year: 2009).*

(Continued)

*Primary Examiner* — Christopher P McAndrew
(74) *Attorney, Agent, or Firm* — Nixon & Vanderhye P.C.

(57) ABSTRACT

An analog matching filter includes a first plate, a second plate coupled with the first plate and separated from the first plate via a spacer, and a replicate matching material fixed to an inside surface of the first plate. A conductive plate or sheet is fixed to an inside surface of the second plate, and an electrical circuit connects the first plate to the conductive plate or sheet. The replicate matching material and the conductive plate or sheet generate an opposite polarization pattern carried by the electrical circuit that is based on a polarization pattern of an animate entity according to a spatial gradient of the animate entity local electric field distribution.

17 Claims, 10 Drawing Sheets

(56) References Cited

U.S. PATENT DOCUMENTS

| | | | |
|---|---|---|---|
| 6,496,114 B1 | 12/2002 | Afilani | |
| 6,674,366 B1 | 1/2004 | Afilani | |
| 6,686,842 B1 | 2/2004 | Afilani | |
| 9,877,658 B2 | 1/2018 | Sidman et al. | |
| 2004/0020771 A1* | 2/2004 | Taniike | G01N 27/3273 204/403.01 |
| 2009/0317297 A1* | 12/2009 | Mahoney | G01N 33/525 422/400 |
| 2011/0070634 A1* | 3/2011 | Takahashi | G01N 33/54366 435/287.7 |
| 2013/0228474 A1* | 9/2013 | Sloss | G01N 33/66 205/792 |
| 2014/0084938 A1* | 3/2014 | Lai | G01R 31/001 324/537 |
| 2014/0111154 A1* | 4/2014 | Roy | H02J 50/50 320/108 |
| 2014/0232381 A1* | 8/2014 | Bernardini | A01K 1/031 324/228 |
| 2017/0363669 A1* | 12/2017 | Dehghan Marvast | A61B 34/20 |

OTHER PUBLICATIONS

Huang, Wesley H. "Optimal line-sweep-based decompositions for coverage algorithms." Proceedings 2001 ICRA. IEEE International Conference on Robotics and Automation (Cat. No. 01CH37164). vol. 1. IEEE, 2001. (Year: 2001).*

International Search Report dated Oct. 17, 2019 issued in PCT International Patent Application No. PCT/US2019/043885, 4 pp.

* cited by examiner

# REMOTE DETECTION OF ANIMATE ENTITIES

CROSS-REFERENCES TO RELATED APPLICATIONS

This application claims the benefit of U.S. Provisional Patent Application Ser. No. 63/056,104, filed Jul. 24, 2020, the entire content of which is herein incorporated by reference.

STATEMENT REGARDING FEDERALLY SPONSORED RESEARCH OR DEVELOPMENT (Not Applicable)

BACKGROUND

The present invention relates to methods and apparatus for locating various entities, including human beings and animals, by observing and detecting a force and subsequent resulting torque, acceleration, vibration or other measurable, quantifiable manifestation of the force created by the non-uniform three-dimensional electric field spatial gradient pattern exhibited uniquely by an animate entity and being detected by the device of the present invention.

The detection of visually obscured entities has many uses in wildlife/endangered species searches, fire-fighting, search and rescue operations, law enforcement operations, military operations, etc.

While prior art devices are known that detect humans, animals and other materials, some by measuring changes in an electrostatic field, none of the operable prior art devices uses the force resulting from the non-uniform electric field squared spatial gradient three-dimensional pattern exhibited uniquely by an animate entity to indicate the line-of-bearing direction of the subject animate entity relative to the device.

A first type of technology is visual amplification via lens and digital means. Examples include binoculars and video enhancing software.

A second type of technology is infra-red/heat sensing sensors. Examples include FLIR and night vision devices A third type of technology is radar. Examples include ground penetrating radar and thru-the-wall radar.

A fourth type of detection technology is trained canines using their keen sense of smell.

SUMMARY

By using an electrokinetic effect, dielectrokinesis (phoresis), which induces a force and subsequent resulting movement on a beam and other component parts of the device, the present invention gives a rapid line-of-bearing directional location indication of the subject animate entity. A meter can also be provided to indicate the direction of strongest non-uniform electric field squared spatial gradient signal strength for those situations where the dielectrokinetic (phoretic) force and subsequent resulting torque, acceleration, vibration or any other measurable quantifiable manifestation of the force is extremely small and difficult to detect.

The primary use of the present invention is to locate animate entities and, in particular, human beings, irrespective of the presence or absence of obscuring material structures (walls, trees, earthen mounds, etc.), of RFI and EMI interference signals, of adverse weather conditions, and of day or night visibility conditions.

The nature and source of an animate entity's (in particular human) electric field and its spatial gradient being detected in the dielectrokinesis (phoresis) effect generating the directionally self-correcting force and subsequent torque characteristic of an animate entity, line-of-bearing locator device has been discussed in Bioelectromagnetism, R. Plonsey et al. (eds.), Oxford University Press (1995) and R. A. Rhoades, Human Physiology, Harcourt Brace Javanioch (1992). The empirical evidence in the case of humans is quite persuasive that human heart electro-physiology generates by far the strongest electric field and spatial gradient pattern. In human physiology, the central and peripheral nervous system neurons, the sensory system cells, the skeletal muscular system, the independent cardiac conduction cells, and the cardiac muscle system cells operate via polarization and depolarization phenomena occurring across all respective cellular membranes. The electric potentials associated with these polarization fluctuations are routinely used at a human body surface for empirical correlation/clinical diagnostic purposes, such as the ECG for the heart and the EEG for the brain. The heart has by far (about a factor of 50 to 60 compared to the brain) the largest voltage, electric field and electric field spatial gradient pattern in the human body compared to the other operating systems mentioned above.

The human heart is a special case wherein the conduction SA node, the VA node, Purkinje fibers, etc. provide high polarization (95 mV) and very rapid (ms) depolarization (110 mV) potentials. The dipole electric field fluctuations are periodic and frequent. The carrier frequency of de- and re-polarizations occurs in a range of 72 for adults to 120 in babies (beats per min. or 1.2 to 2.0 Hz). The frequency spectra of ECG patterns have main lobes at about 17 Hz. In sub-ULF (0 to 3 Hz) and ULF (3 to 30 Hz) frequency ranges, the electric and magnetic fields are quasi-static and are not strongly coupled as "EM waves," and EM activities detected in these ranges have a predominantly magnetic or electric nature (heart electric field is many times larger than heart magnetic field, see Bioelectromagnetism, R. Plonsey et al., Oxford University Press (1995)) as discussed in D. O. Carpenter, Biological Effects of EM Fields, Academic Press (1994). Normal neuron or cardiac activity aberrations, such as strokes/heart attacks, create a temporary or permanent depolarization resulting in loss of polarization and an inability to repolarize. The heart's resultant polarization electric field distribution pattern has a high degree of spatial non uniformity and can be characterized as a moving dipolar charge distribution pattern during each heartbeat. The human heart electric field pattern is unique and is thus able to be detected.

Mammalian physiology results for the ULF dielectric constants of mammalian (human) living tissues, wherein mammalian (human) tissues are 70% volume water (dielectric constant 78), show that all the ordinary animate human tissues, like heart, brain, liver, blood, skin, lung and even bone, have quite extraordinarily high ULF dielectric constants ($10^5$ to $10^7$), found only very rarely in usual inanimate dielectric materials. See Biomedical Engineering Handbook, J. D. Bronzino (ed.), CRC Press (1995); Physical Properties of Tissue, F. A. Duck, Academic Press (1990); H. 60 P. Schwan, Advances in Biological and Medical Physics, 5, 148 to 206 (1957); E. Grant, Dielectric Behaviour of Biological Molecules, Oxford Univ. (1978) and Handbook of Biological Effects of Electromagnetic Fields, 2nd Ed., C. Polk et al., CRC Press (1996).

It is also found that as the animate tissues die these extraordinarily high ULF dielectric constants collapse downward greatly to more normal inanimate values over time as the dying tissue becomes, over time, inanimate. The reason for the great differences is the routine occurrence of other polarization modes in animate materials, but which occur very rarely in inanimate materials. These other polarization modes are interfacial (inhomogeneous materials) and pre-polarized elements which occur readily in all animate tissues. It is known that the rest state of the human neural, cardiac, skeletal muscular and sensory systems are states of high polarization and are induced via ion (K+, Na+, Ca++, etc.) transport across various membranes. Action potentials from this transport are used to maintain the systems' normal polarized state and to trigger the systems' activities via depolarization and follow-up rapid repolarization signals. Dielectrophoresis has been practiced mostly using exclusively artificially-set-up external non-uniform electric field patterns in laboratories to dielectrically separate individual (gm size) inanimate, inorganic particles or um size living cells (see, H. A. Pohl, Dielectrophoresis, Cambridge University Press (1978) and H. A. Pohl, Electrostatics and Applications, Chapters 14 and 15, A. D. Moore (Editor), Interscience Press (1973) and T. B. Jones, Electromechanics of Particles, Cambridge University Press (1995)). The problems of this prior art in trying to observe the dielectrokinesis (phoresis) force and torque effects in meter-size ensembles of tens of billions of vertebrate cells coupled biochemically and working in concert as an animate entity are overcome by utilizing naturally-occurring electric field spatial gradient patterns, in particular the largest electric field spatial gradient pattern occurring in vertebrates, the one associated with vertebrate's beating heart, illustrated by the electrocardiogram (ECG). A vertebrate is any animal having a backbone and some form of heart (one or more chambers) with a characteristic backbone.

The analog matching filter is an essential element in triggering and also maximizing both the mechanical torque and energy replenishment modes using dielectrokinesis (phoresis) methods to detect entities. This filtering action applies to a practically limitless range of materials to be detected as an animate entity of interest target. The dielectric replicate material comprising the analog matching filter functionally performs a spatial dielectric property matching between the animate entity of interest and a locator device to locate the animate entities. The filter enables the device to operate using the dielectrokinesis (phoresis) phenomena to specifically detect only those animate entities matching the dielectric response signature of the analog matching filter component. The dielectric signature includes both the dielectric constant and dielectric loss frequency spectra and all characteristic time constants controlling the polarization evolution/mechanics in external electric fields.

There are two primary elements for the dielectrokinesis (phoresis) animate entity location detection device to operate. The first element is an external electric field and spatial gradients thereof, and the second element is the selective dielectric analog matching filter of the described embodiments. As noted above, the external electric field and gradients thereof can be provided by the entity of interest itself as is the case with animate species.

The analog matching filter of the described embodiments can be used with conventional electronic components (resistors, capacitors, inductors, transistors, etc.) in the overall operational design of the type of locator device used to detect the presence or absence of a specific entity of a predetermined type.

The external electric field and gradients thereof of the target entity defines a specific polarization pattern for the animate entity. In order to detect the target entity electric field and gradients thereof, it is necessary to impart an opposite polarization pattern on a detector element such as a beam, antenna, dielectric collector or the like.

It has been discovered that specific combinations of materials provide the desired effects of the analog matching filter.

BRIEF DESCRIPTION OF THE DRAWINGS

These and other aspects and advantages will be described in detail with reference to the accompanying drawings, in which.

DETAILED DESCRIPTION

Figure 1:
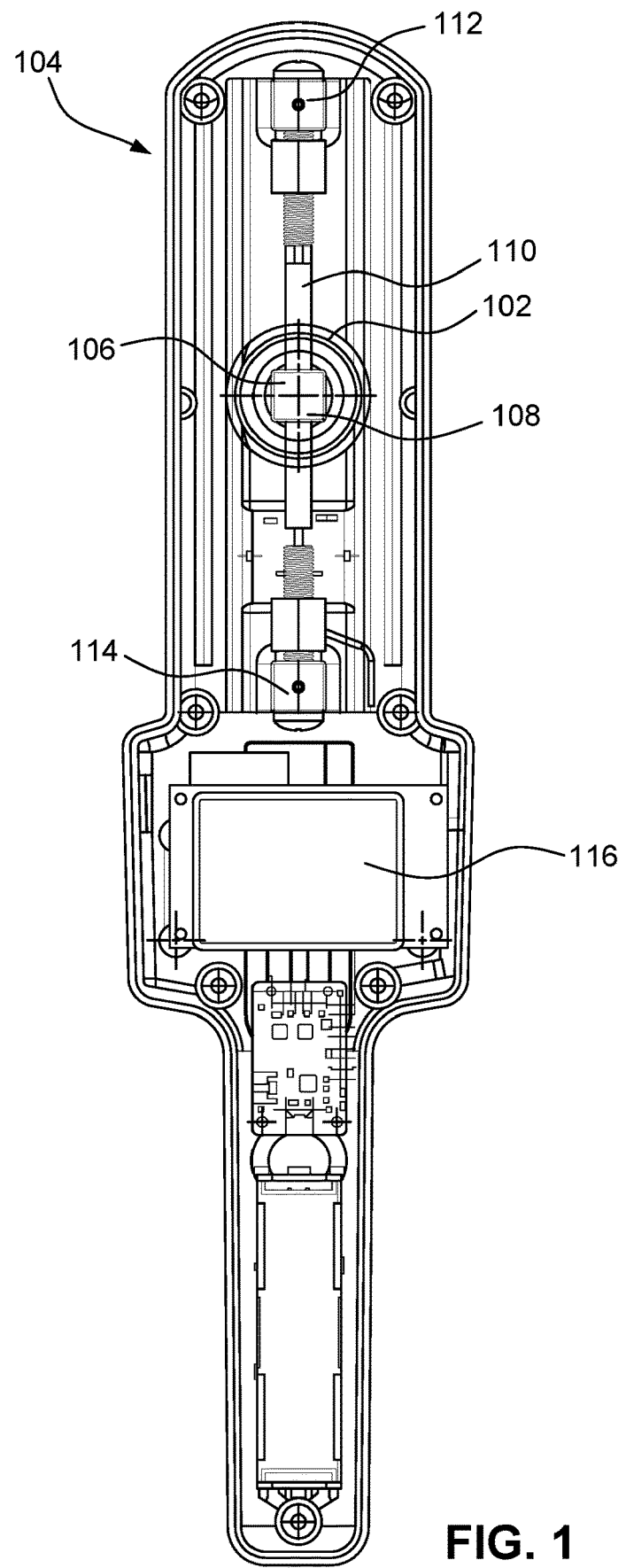
FIG. 1 is a schematic illustration of an exemplary detecting apparatus according to the described embodiments.

In an exemplary embodiment, with reference to FIGS. 1-4, a frictionless bearing 102 is attached to a detector enclosure 104. A bearing center post 106 is connected to the dielectrokinesis (phoresis) (DEP) beam support 108. The dielectrokinesis (phoresis) beam support 108 holds the dielectrokinesis (phoresis) beam 110. The dielectrokinesis (phoresis) beam may be entirely magnetic. The dielectrokinesis (phoresis) beam 110 may have magnetic ends. At the front-end, a support or bar 112 which is entirely magnetic or may have magnetic end 113 is held proximate to the dielectrokinesis (phoresis) beam. The magnetic north and south fields have an attractive force which holds the dielectrokinesis (phoresis) beam 110 in alignment. At the rear of the dielectrokinesis (phoresis) beam a similar support or bar 114 and magnetic end 115 hold the rear of the dielectrokinesis (phoresis) beam 110 in constant alignment.

The arrangement enables the dielectrokinesis (phoresis) beam 110 to react to the dielectrokinesis (phoresis) force in response to the dielectrokinesis (phoresis) effect generating the directionally self-correcting force and subsequent torque characteristics of the dielectrokinesis (phoresis) force. In other embodiments, the dielectrokinesis (phoresis) beam 110 may be described as the cantilever beam or the internal member.

Figure 2:
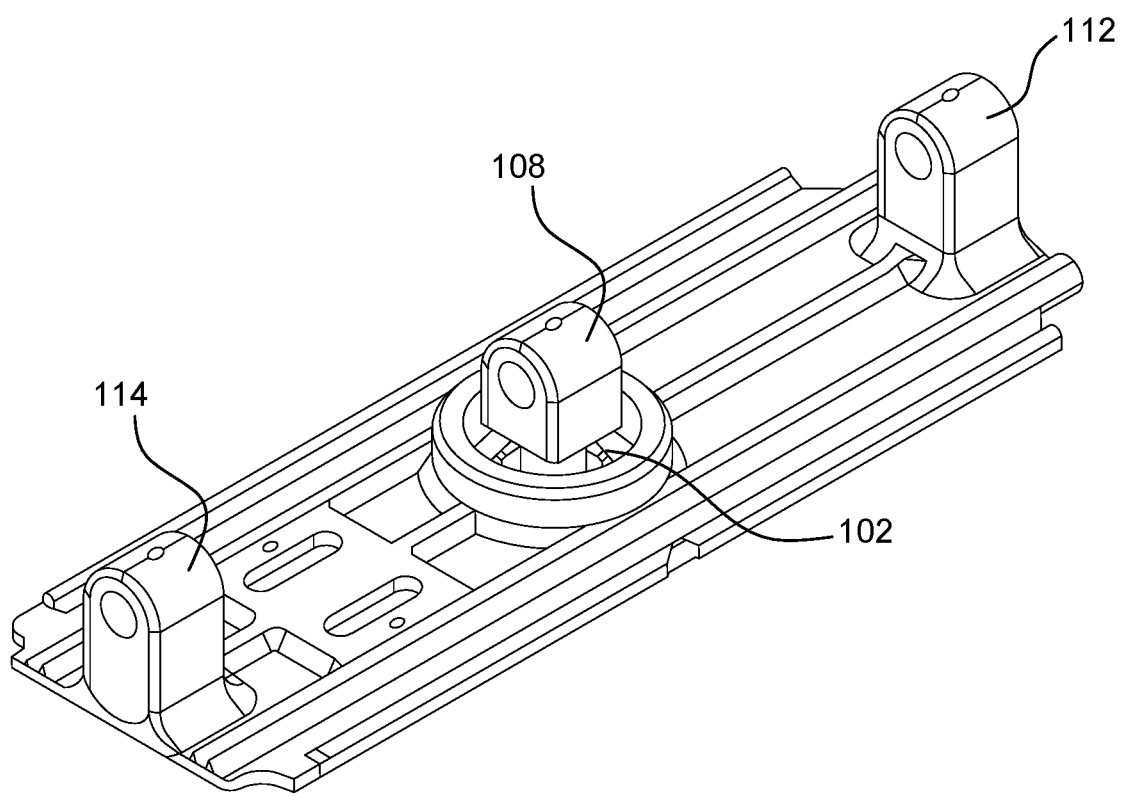
FIG. 2 is a detector subcomponent.

FIG. 2 is the detector sub-component containing the frictionless bearing 102, dielectrokinesis (phoresis) beam support 108, and the front and rear magnetic supports 112, 114.

Figure 3:
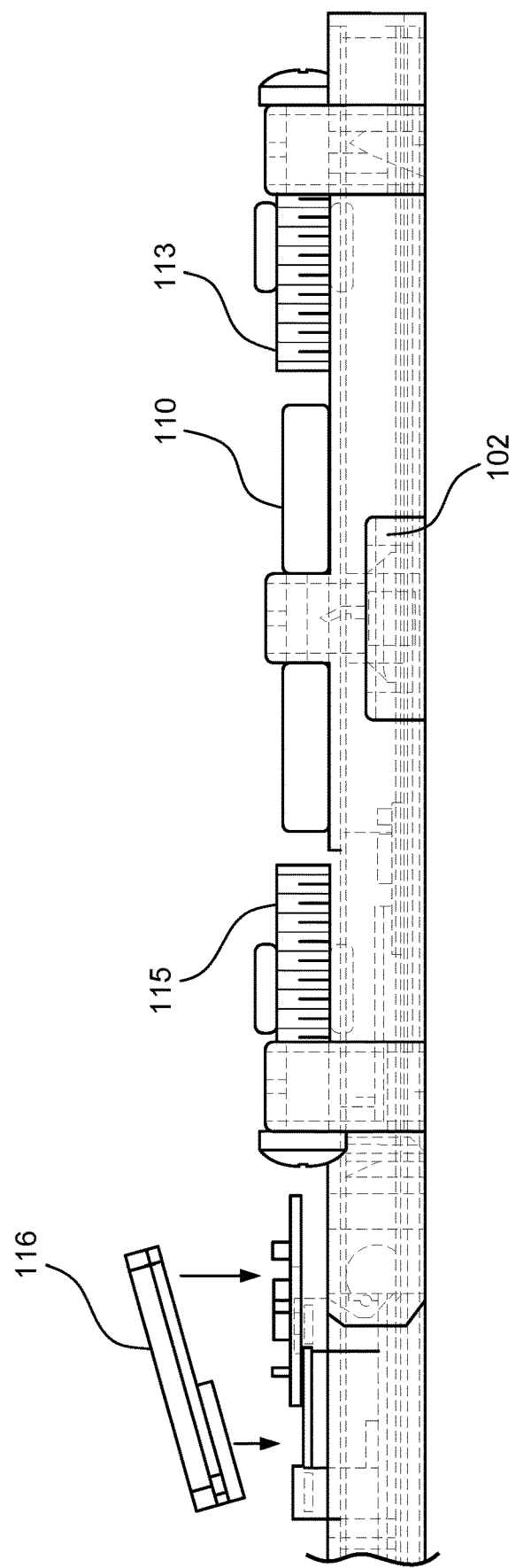
FIG. 3 is cross section of FIGS. 1 and 2.

FIG. 3 is a cross section of the detector showing the subcomponent of FIG. 2, the detector housing 104 of FIG. 1 and cross section of the detector display 116.

Figure 4:
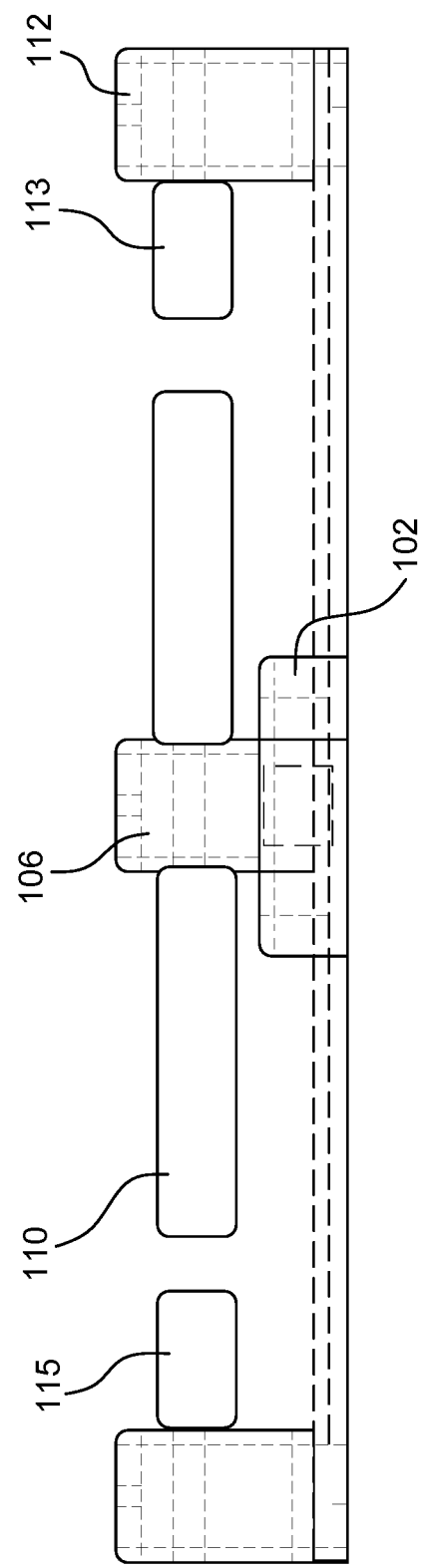
FIG. 4 shows FIG. 2 with magnetic arrangement.

FIG. 4 is the detector subcomponent of FIG. 2 in cross section details of the magnetic arrangement.

Figure 5:
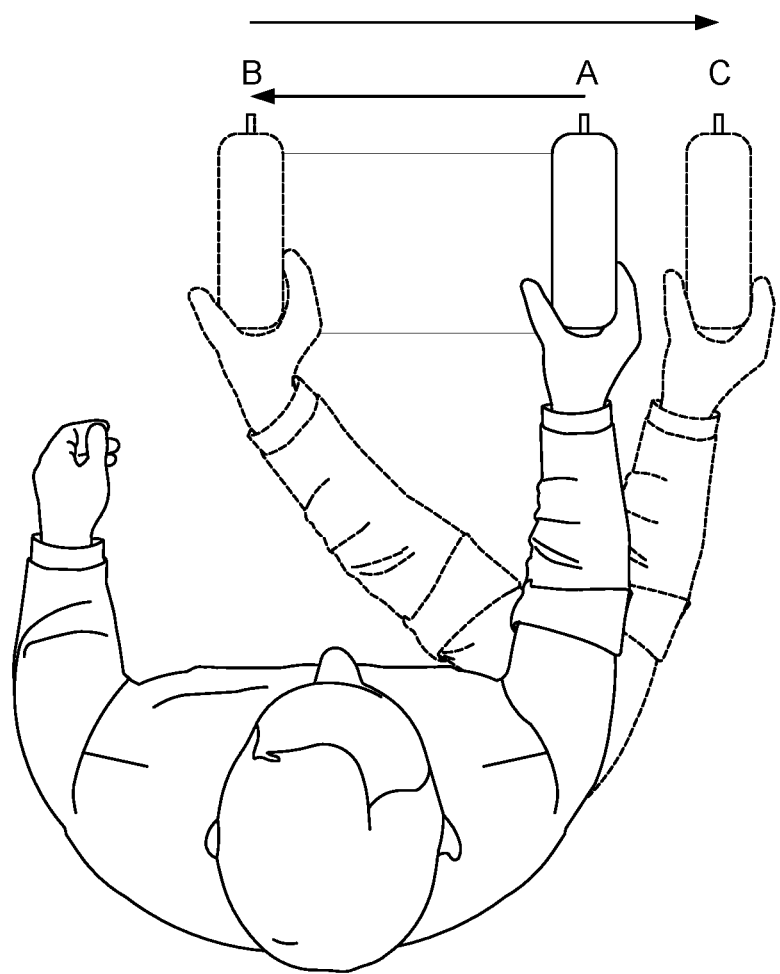
FIG. 5 shows a method of using the sensor device of the described embodiments.

In FIG. 5, an operator moves the locator in a horizontal movement beginning in position A, then moving horizontally to position B. Immediately the operator moves the locator horizontally to position C. The movement from position A, to position B to position C may be repeated several times. The display on the location provides digital outputs from the sensors monitoring the dielectrokinesis (phoresis) beam.

Figure 6:
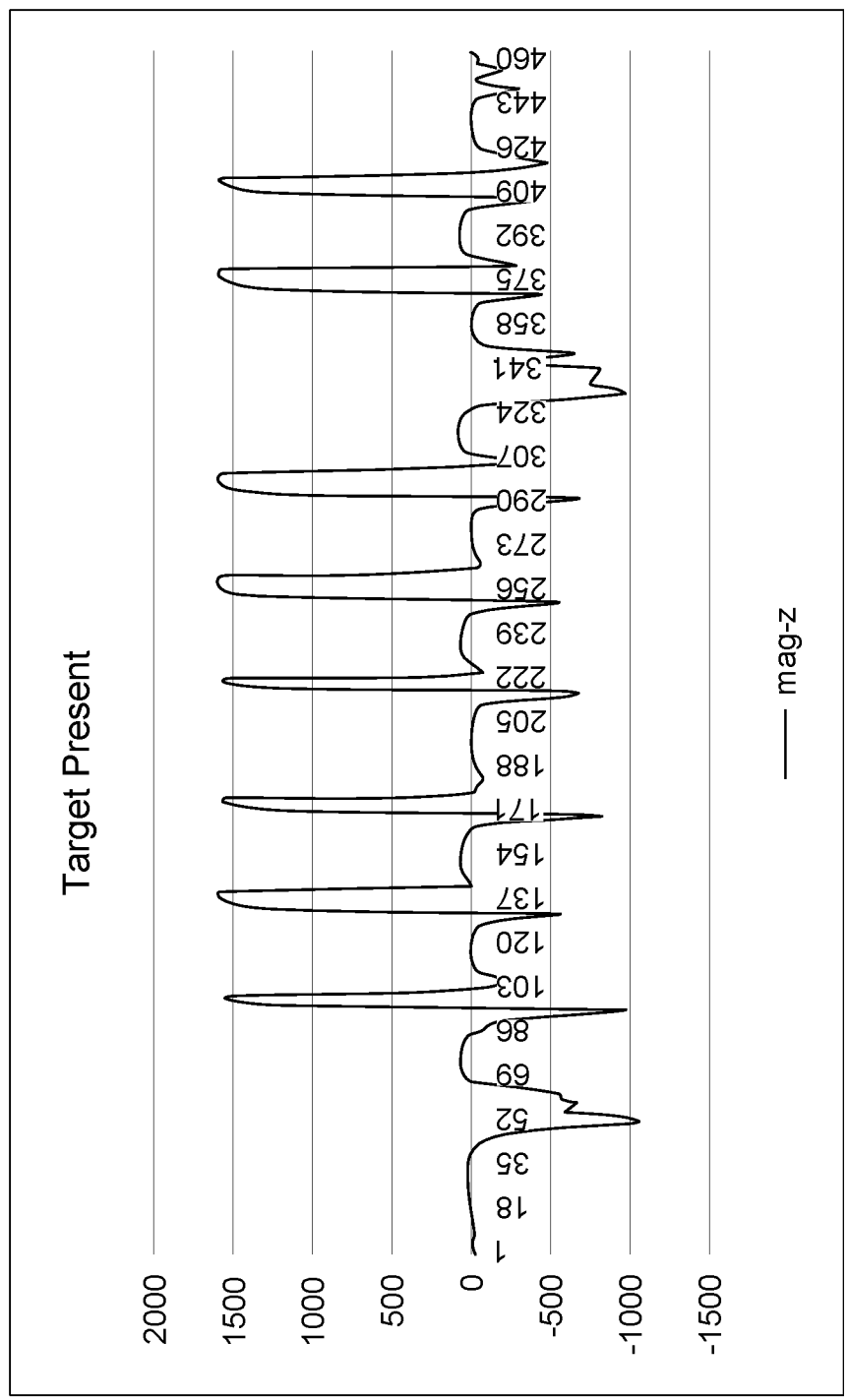
FIGS. 6 and 7 are graphic displays of a comparative overlay of center beam forces when a target is present compared to when a target not present.
Figure 7:
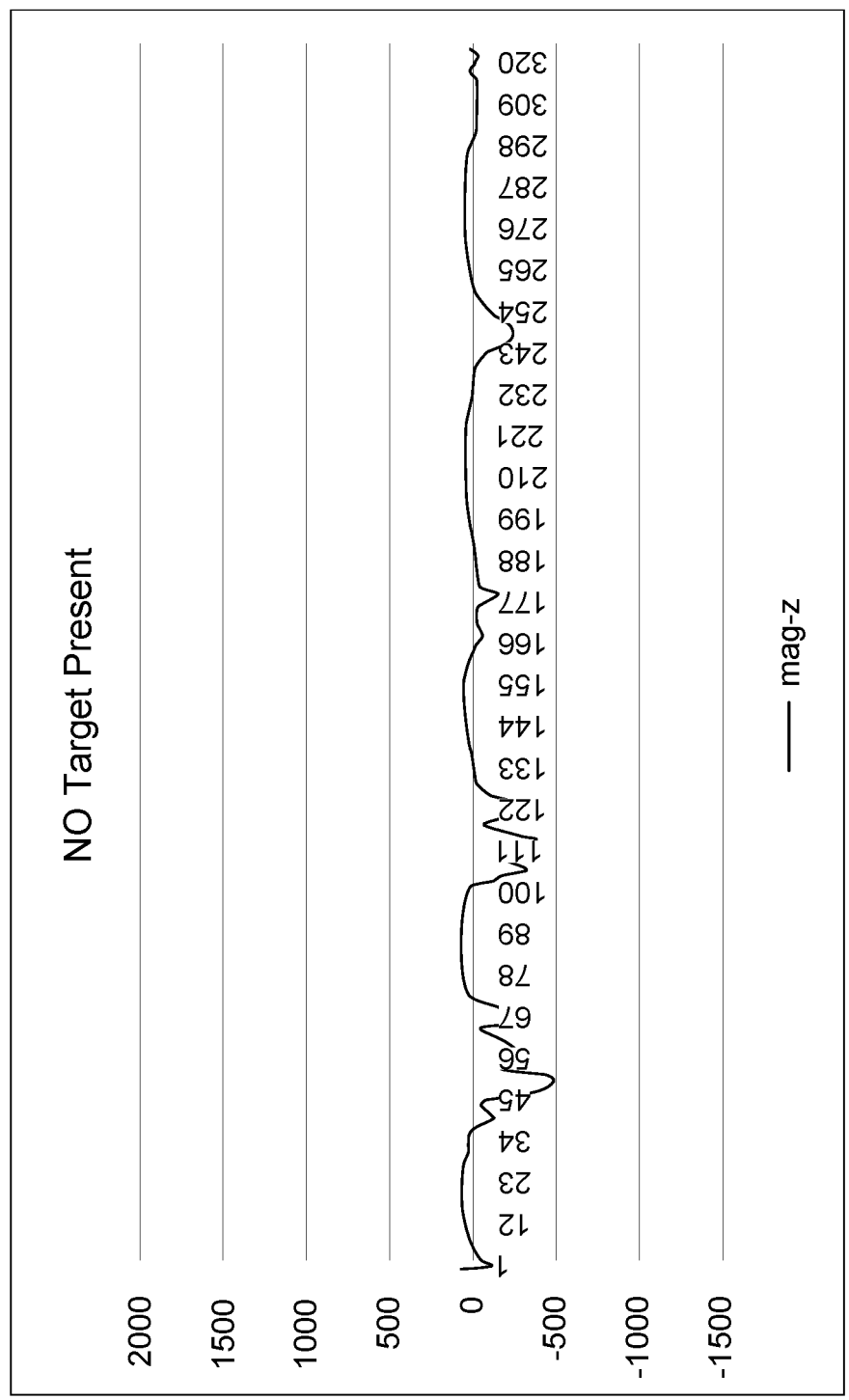

With reference to FIG. 6, the DEP impulse functions produce a distinctive target present waveform as compared to the waveform when no target is present as shown in FIG. 7. Analytical methods can be used to compare the waveform characteristics, to contrast center beam DEP forces to the remote detector enclosure movements indicated by included accelerometer and gyroscopic sensors.

Figure 8:
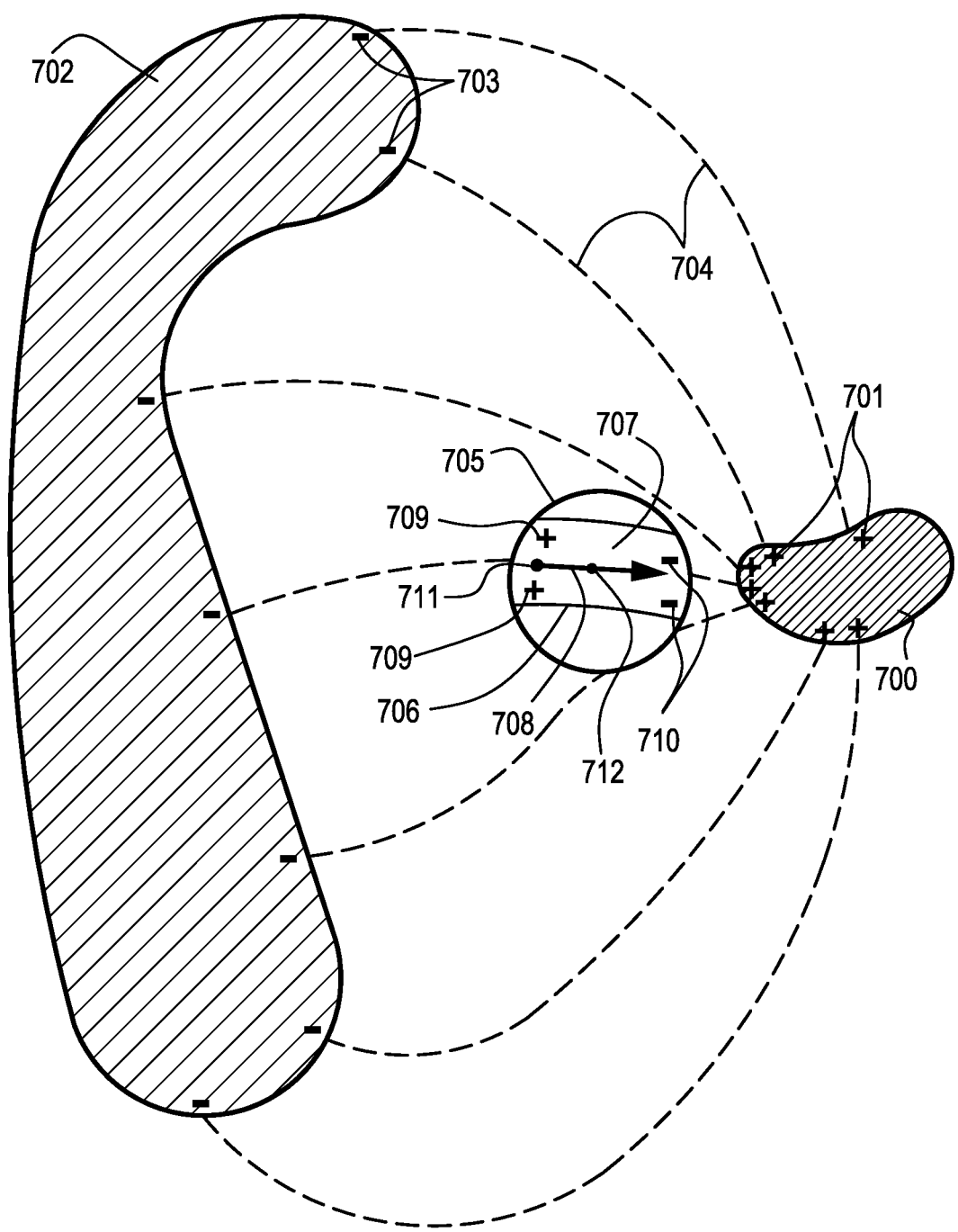
FIG. 8 is a schematic drawing of an entity, a ground plane, the invented device and the entity's polarization electric fields.

FIG. 8 shows a target animate entity of interest 700 and a surrounding ground plane 702. The animate entity's polarization charges 701 produce non-uniform electric field lines 704 that have a unique spatial pattern as shown. The non-uniform electric field lines 704 also have a unique spatial gradient pattern (not shown). The non-uniform electric field lines 704 terminate on the surrounding ground plane 702 and induce opposite polarization charges 703 thereon. An initially neutral matter or medium 705, such as the device of the described embodiments, is shown amidst the non-uniform electric field lines. The neutral matter 705 includes a cavity 706 filled with a specific dielectric material 707. The non-uniform electric field lines induce polarization charges 709 and 710 in the dielectric material 707. The neutral matter 705 also contains protuberant antennas or beams 708 that are formed from a dielectric material and are in direct contact with the cavity 706 and the dielectric material 707.

The protuberant antennas or beams 708 form a pivot line 711. The dielectrokinetic (phoretic) force manifests itself as an easily detected torque motion of the antennas or beam 708 about the pivot line 711. In the case of a beam embodiment, the dielectrokinesis (phoresis) force manifests as a torque about pivot point 712.

Obvious extensions of the ideas presented in this invention can be used to detect other animate entities including member species of the animal kingdom including mammalia other than homo-sapiens, ayes (birds), reptilia (reptiles), amphibia (frogs and other amphibians), etc.

Figure 9:
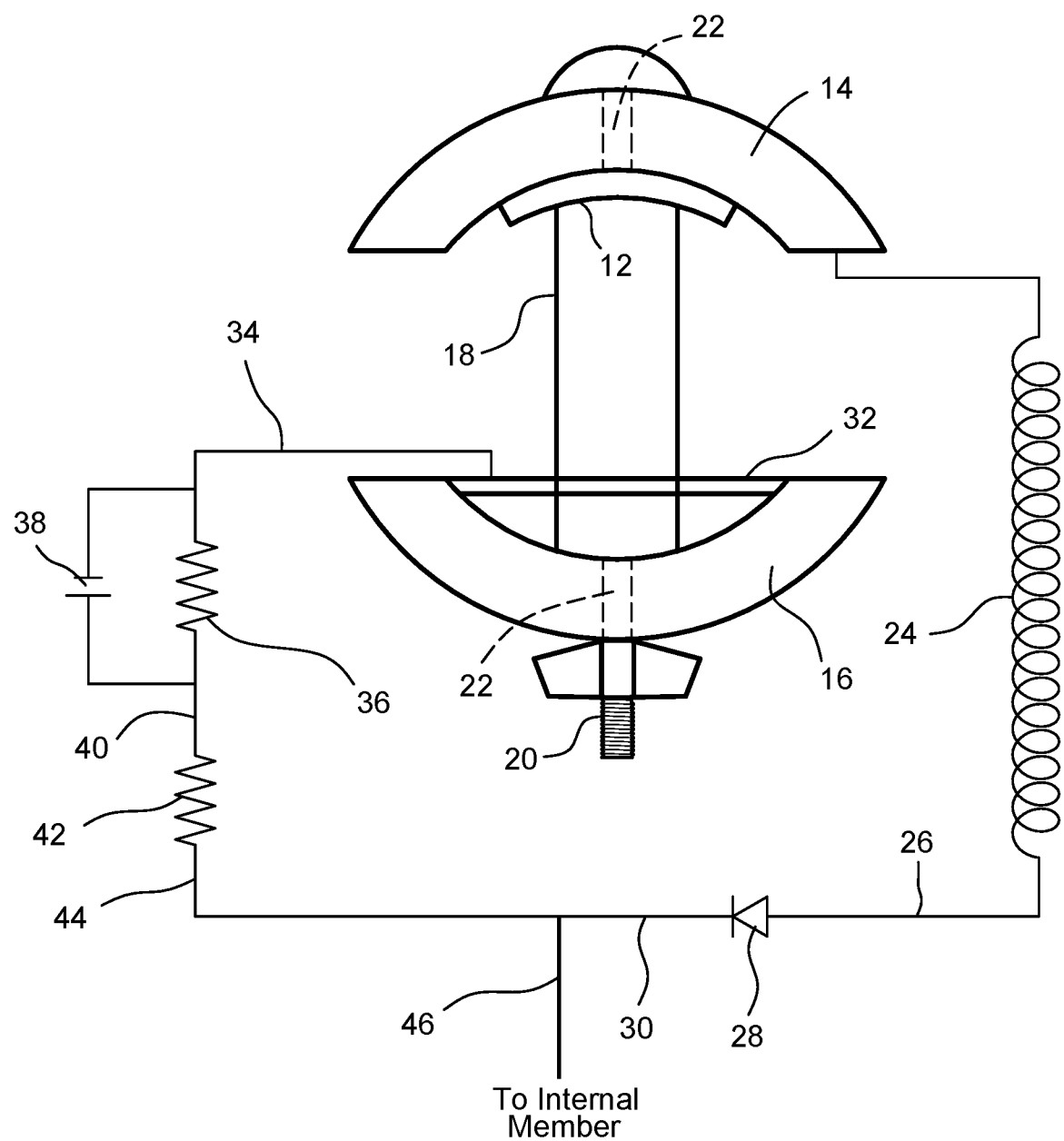
FIGS. 9 and 10 show an analog matching filter arrangement.
Figure 10:
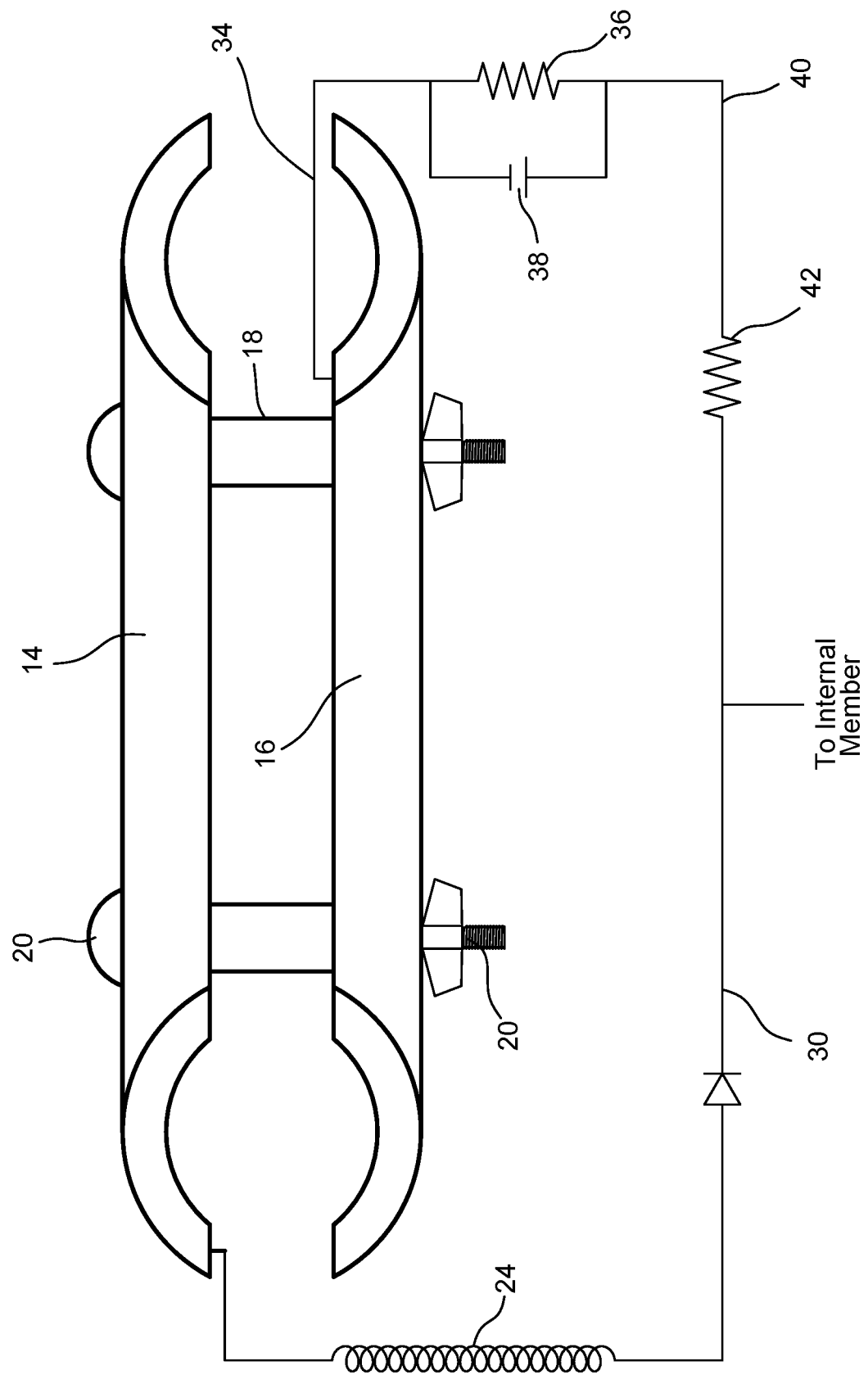

In FIGS. 9 and 10, the analog matching filter includes a replicate dielectric property matching material 12 within a spaced plate arrangement including a first plate 14 coupled with a second plate 16. As shown, the plates 14, 16 may be curved along their longitudinal axes with concave surfaces facing each other. Alternatively, the plates 14, 16 may be parallel or constructed in different shapes. The pair of plates 14, 16 disposed enclosing the replicate dielectric property matching material 12 are held at a preferred distance by nylon spacers 18 secured via a suitable fastener 20. The plates 14, 16 may be formed by acrylonitrile-butadiene-styrene (ABS), for example, or other suitable polymers.

Each plate 14, 16 may be provided with a hole 22 at ends thereof or in each of the four corners of the plates. The plates 14, 16 are held at a set distance determined by the replicate material 12 by two to four of the spacers 18 through the holes 22. Each of the fasteners 20 passes through one of the holes 22 in the plates 14, 16, through the spacer 18, through the opposing hole 22 in the opposite plate 14, 16, and a nut is applied to the threaded section of the fastener 20 to secure the plate 14, 16 and the spacers 18. The fastener 20 may be any suitable material such as stainless steel or nylon.

The replicate material 12 is disposed on an interior surface of the first plate 14 via an adhesive or the like such as cyanoacrylate. The amount of adhesive may be minimized so that the surface of the replicate material 12 is exposed and not encased by the adhesive. The replicate material 12 functionally performs a spatial dielectric property matching.

A silver coated copper wire 24 is connected to the first plate 14. The connection may be made in any suitable manner, and in an exemplary embodiment, the connection is made by drilling a hole in the cross section of the first plate 14 that is slightly larger than the diameter of the silver coated wire 24. An adhesive such as cyanoacrylate may be used to connect the first plate 14 at the drilled hole to the end of the silver-plated copper wire 24. The end of the silver coated silver wire 24 is inserted into the drilled hole in the first plate 14. The length of the wire 24 may be nominally two inches. The silver coated copper wire 24 serves to reduce impedance.

A first conductive wire 26 connects the silver coated copper wire 24 to a diode 28. The connections are made by solder or the like. The diode 28 allows current to flow from the wire 24 through the diode 28. A second conductive wire 30 connects the diode 28 to a second resistor 42 and an internal member 46 of a detector element.

A copper plate or sheet 32 is attached to an interior surface of the second plate 16 by an adhesive, such as cyanoacrylate. A third conductive wire 34 connects the copper plate 32 to a first resistor 36 and a first capacitor 38 in parallel. The connections may be made by solder or other suitable alternative. The first resistor 36 and the first capacitor 38 serve to produce a time constant less than 10 Hz.

A fourth conductive wire 40 connects the first resistor 36 and the first capacitor 38 in parallel to a second resistor 42 in series. The connection may be made by solder or an alternative. The second resistor 42 serves to increase the total resistance in the path thereby adjusting the time constant of arrangement in the frequency range below 10 Hz.

A fifth conductive wire 44 connects the second resistor 42 to the diode 28. The connection of the fifth conductive wire 44 from the second resistor 42 and the diode 28 is connected by a sixth conductive wire 46 to an internal member. The internal member reacts to currents in the conductive wires according to the principles of the described embodiments. The first plate 14 containing the replicate material 12 is connected electrically to the copper plate 32. The arrangement permittivity transmits (or "permits") an electric field to charge an analog matching filter, as described in the present application, and allows electric field charge to be stored and converted to a dielectrokinesis (phoresis) force. The selective permittivity is arranged in an analog matching filter in an RC circuit that enables the electric field stored charge to be converted to the Dielectrokinesis (phoresis) force, thereby enabling the detection of an entity. The values of the resistors, capacitors and diodes are determined by the replicate material selected. That is, these values will vary for different replicate materials. The analog matching filter is capacitively coupled to the detector enclosure 104 (see FIG. 1). In one embodiment of the analog matching filter, the permittivity of the analog matching filter is below 1 Hz. Above 1 Hz, the analog matching filter does not permit a charge to be stored. Below 1 Hz, the analog matching filter permits storage of a charge that is transmitted from the internal member through the conductive wires and RC component. The stored charge is then converted to the dielectrokinesis (phoresis) force on the internal member.

The replicate dielectric property matching material 12 is selected in accordance with the characteristics of the entity to be detected. That is, the replicate property matching material contains identical dielectric properties, time constants and related macroscopic friction coefficients to those of the entity material to be detected.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

The invention claimed is:

1. An analog matching filter comprising:
a first plate;
a second plate coupled with the first plate and separated from the first plate via a spacer;
a replicate matching material fixed to an inside surface of the first plate;
a conductive plate or sheet fixed to an inside surface of the second plate; and
an electrical circuit connecting the first plate to the conductive plate or sheet, wherein an external electric field and gradients thereof of a target animate entity define a polarization pattern for the animate entity according to a spatial gradient of the animate entity local electric field distribution, and wherein the replicate matching material and the conductive plate or sheet generate an opposite polarization pattern carried by the electrical circuit.

2. An analog matching filter according to claim 1, wherein the replicate material is configured to perform a spatial dielectric property matching of the animate entity.

3. An analog matching filter according to claim 1, wherein the replicate matching material is selected in accordance with dielectric polarization characteristics of the animate entity.

4. An analog matching filter according to claim 1, wherein the replicate matching material comprises one or more dielectric materials.

5. An analog matching filter according to claim 1, wherein the replicate matching material comprises the animate entity.

6. An analog matching filter according to claim 1, wherein the replicate matching material comprises identical dielectric properties, time constants and related macroscopic friction coefficients to those of the animate entity.

7. An analog matching filter according to claim 1, wherein the replicate matching material comprises compositions of nitrated cellulose and nitroglycerin.

8. A sensor device for detecting an animate entity, the sensor device comprising:
a housing;
a first analog matching filter and a second analog matching filter, each of the first and second analog matching filters comprising:
a first plate,
a second plate coupled with the first plate and separated from the first plate via a spacer,
a replicate matching material fixed to an inside surface of the first plate,
a conductive plate or sheet fixed to an inside surface of the second plate, and
an electrical circuit connecting the first plate to the conductive plate or sheet wherein an external electric field and gradients thereof of the animate entity define a polarization pattern for the animate entity according to a spatial gradient of the animate entity local electric field distribution, and wherein the replicate matching material and the conductive plate or sheet in at least the first analog matching filter generate an opposite polarization pattern carried by the electrical circuit;
an internal member that is configured to react to the opposite polarization pattern carried by the electrical circuit; and
a switch coupled with the first and second analog matching filters, the switch selectively activating the first analog matching filter or the second analog matching filter.

9. A sensor device according to claim 8, wherein the replicate matching material of the first analog matching filter is different from the replicate matching material of the second analog matching filter.

10. A sensor device according to claim 8, wherein the replicate matching material of the at least the first analog matching filter is selected in accordance with respective dielectric polarization characteristics of the animate entity.

11. A sensor device according to claim 8, wherein the replicate matching material in at least the first analog matching filter is configured to perform a spatial dielectric property matching of the animate entity.

12. A sensor device according to claim 8, wherein the replicate matching material in at least the first analog matching filter is selected in accordance with dielectric polarization characteristics of the animate entity.

13. A sensor device according to claim 8, wherein the replicate matching material in each of the first and second analog matching filters comprises one or more dielectric materials.

14. A sensor device according to claim 8, wherein the replicate matching material in at least the first analog matching filter comprises animate entity.

15. A sensor device according to claim 8, wherein the replicate matching material in at least the first analog matching filter comprises identical dielectric properties, time constants and related macroscopic friction coefficients to those of the animate entity.

16. A sensor device according to claim 8, wherein the replicate matching material in at least the first analog matching filter comprises compositions of nitrated cellulose and nitroglycerin.

17. A method of detecting an animate entity from a distance using a sensor including a first plate, a second plate coupled with the first plate and separated from the first plate via a spacer, a replicate matching material fixed to an inside surface of the first plate, a conductive plate or sheet fixed to an inside surface of the second plate, and an electrical circuit connecting the first plate to the conductive plate or sheet, wherein an external electric field and gradients thereof of the animate entity define a polarization pattern for the animate entity according to a spatial gradient of the animate entity local electric field distribution, the method comprising:
(a) moving the sensor in a first direction with the sensor distanced from the animate entity; and
(b) after step (a), moving the sensor in a second direction, opposite from the first direction, with the sensor distanced from the animate entity, wherein steps (a) and (b) cause the sensor to pass through unique electric field spatial gradients of the animate entity.

* * * * *